(12) United States Patent
Cernea

(10) Patent No.: US 6,922,358 B2
(45) Date of Patent: Jul. 26, 2005

(54) SEGMENTED METAL BITLINES

(75) Inventor: Raul Adrian Cernea, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/886,299

(22) Filed: Jul. 6, 2004

(65) Prior Publication Data

US 2005/0002232 A1 Jan. 6, 2005

Related U.S. Application Data

(63) Continuation of application No. 10/418,416, filed on Apr. 18, 2003, now Pat. No. 6,856,541, which is a continuation of application No. 09/960,586, filed on Sep. 21, 2001, now Pat. No. 6,552,932.

(51) Int. Cl.[7] .............................................. G11C 11/34
(52) U.S. Cl. .............................. 365/185.05; 365/185.17
(58) Field of Search ........................ 365/185.05, 185.17

(56) References Cited

U.S. PATENT DOCUMENTS

| | | | |
|---|---|---|---|
| 5,095,344 A | 3/1992 | Harari ........................ 257/328 |
| 5,172,338 A | 12/1992 | Mehrotra et al. ....... 365/185.03 |
| 5,270,979 A | 12/1993 | Harari et al. .......... 365/185.09 |
| 5,315,541 A | 5/1994 | Harari et al. .......... 365/185.03 |
| 5,380,672 A | 1/1995 | Yuan et al. ................. 438/257 |
| 5,602,987 A | 2/1997 | Harari et al. ................... 714/8 |
| 5,642,312 A | 6/1997 | Harari ................... 365/185.03 |
| 5,682,350 A | 10/1997 | Lee et al. ............... 365/185.13 |
| 5,712,180 A | 1/1998 | Guterman et al. .......... 438/263 |
| 5,754,469 A * | 5/1998 | Hung et al. ............ 365/185.03 |
| 5,796,671 A | 8/1998 | Wahlstrom ............. 365/230.03 |
| 5,856,938 A | 1/1999 | Kasai et al. ................ 365/149 |
| 5,991,517 A | 11/1999 | Harari et al. ................... 714/3 |
| 6,091,633 A | 7/2000 | Cernea et al. .......... 365/185.13 |
| 6,147,910 A | 11/2000 | Hsu et al. ............... 365/185.25 |
| 6,222,762 B1 | 4/2001 | Guterman et al. ...... 365/185.03 |
| 6,230,233 B1 | 5/2001 | Lofgren et al. .............. 711/103 |
| 6,335,874 B1 | 1/2002 | Eitan ............................ 365/63 |
| 6,532,172 B2 | 3/2003 | Harari et al. ........... 365/185.14 |
| 6,552,932 B1 | 4/2003 | Cernea ................... 365/185.05 |
| 6,621,733 B2 | 9/2003 | Chin ...................... 365/185.06 |

FOREIGN PATENT DOCUMENTS

| | | |
|---|---|---|
| JP | 63053787 | 3/1988 |
| JP | 63222390 | 6/1988 |
| JP | 09282891 | 10/1997 |

OTHER PUBLICATIONS

International Searching Authority, European Patent Office, "Notification of Transmittal of the International Search Report or the Declaration" for PCT application No. PCT/US02/29760, Sep. 11, 2003, 8 pages.

European Patent Office, "Examiner's Report", mailed in corresponding European application 02766312.9 on Oct. 21, 2004, 3 pages.

* cited by examiner

Primary Examiner—Michael Tran
(74) Attorney, Agent, or Firm—Parsons Hsue & de Runtz LLP

(57) ABSTRACT

An array of memory cells of an integrated circuit are organized so metal bitlines are segmented. The memory cells may be nonvolatile memory cells such as floating gate, Flash, EEPROM, and EPROM cells. The bitlines for the memory cells are strapped to metal, and the metal bitline is segmented. The individual segments may be selectively connected to voltages as desired to allow configuring (e.g., programming) or reading of the memory cells. The programming voltage may be a high voltage, above the VCC of the integrated circuit. By dividing the metal bitlines into segments, this reduces noise between bitlines and improve the performance and reliability, and reduce power consumption because the parasitic capacitances are reduced compared to a long metal bitline (i.e., where all the segments are connected together and operated as one).

7 Claims, 7 Drawing Sheets

SEGMENTED METAL BITLINES

CROSS-REFERENCE TO RELATED APPLICATIONS

This application is a continuation of application Ser. No. 10/418,416, filed Apr. 18, 2003, now U.S. Pat. No. 6,856,541 which is a continuation of application Ser. No. 09/960,586, filed Sep. 21, 2001, now U.S. Pat. No. 6,552,932, which applications are incorporated herein in their entirety by this reference.

BACKGROUND OF THE INVENTION

The present invention relates to nonvolatile erasable programmable memories and more specifically, techniques for organizing or laying out the memory cells on the integrated circuit.

Memory and storage is one of the key technology areas that is enabling the growth in the information age. With the rapid growth in the Internet, World Wide Web (WWW), wireless phones, personal digital assistants (PDAs), digital cameras, digital camcorders, digital music players, computers, networks, and more, there is continually a need for better memory and storage technology. A particular type of memory is nonvolatile memory. A nonvolatile memory retains its memory or stored state even when power is removed. Some types of nonvolatile erasable programmable memories include as Flash, EEPROM, EPROM, MRAM, FRAM, ferroelectric, and magnetic memories. Some nonvolatile storage products include CompactFlash (CF) cards, MultiMedia cards (MMC), Flash PC cards (e.g., ATA Flash cards), SmartMedia cards, and memory sticks.

A widely used type of semiconductor memory storage cell is the Flash memory cell or floating gate memory cell. There are other types of memory-cell technologies such as those mentioned above. Flash and floating gate memory cells are discussed as merely an example. The discussion in this application would also apply to other memory technologies other than Flash and floating gate technology with the appropriate modifications. The memory cells are configured or programmed to a desired configured state. In particular, electric charge is placed on or removed from the floating gate of a Flash memory cell to put the cell into two or more stored states. One state is a programmed state and another state is an erased state. A Flash memory cell can be used to represent at least two binary states, a 0 or a 1. A Flash memory cell can also store more than two binary states, such as a 00, 01, 10, or 11; this cell can store multiple states and may be referred to as a multistate memory cell, a multilevel, or multibit memory cell. This allows the manufacture of higher density memories without increasing the number of memory cells since each memory cell can represent more than a single bit. The cell may have more than one programmed state. For example, for a memory cell capable of representing two bits, there will be four programmed states.

Despite the success of nonvolatile memories, there also continues to be a need to improve the technology. It is desirable to improve the density, speed, durability, and reliability of these memories. It is also desirable to reduce power consumption and reduce the cost per bit of storage.

As can be appreciated, there is a need for improving the performance and reducing the power consumption of nonvolatile memories. In particular, by arranging and laying out the memory cells of an integrated circuit so bitlines of the memory cells are segmented, this will reduce noise between bitlines and improve the performance and reliability, and reduce power consumption.

SUMMARY OF THE INVENTION

The invention provides an organization for memory cells of an integrated circuit where metal bitlines are segments. In a specific embodiment, the memory cells are nonvolatile memory cells such as floating gate, Flash, EEPROM, and EPROM cells. The bitlines for the memory cells are strapped to metal (e.g., metal-2) and this metal is segmented. The individual segments may be selectively connected to voltages as desired to allow configuring (e.g., programming) or reading of the memory cells. By dividing the metal bitlines into segments, this reduces noise between bitlines and improve the performance and reliability, and reduce power consumption because the parasitic capacitances to be charged or discharged are reduced compared to a long metal bitline (i.e., where all the segments are connected together and operated as one). Between the segments are at least two pass gates (e.g., three pass gates). One pass gate connects or disconnects two segments together. For each of the segments, there is a pass gate the connects or disconnects the segment to a supply line. The supply line will be selectively connected to a voltage such as VPP or VSS (ground).

Although the invention has been described with respect to metal bitlines, the invention may also be applied to other metal lines, such as metal wordlines, to obtain similar benefits for those lines. However, the invention, is particularly effective for metal bitlines because the bitlines are raised to a VPP (e.g., 6.5 volts) for programming. And switching from 0 volts to VPP is a significant enough swing that much noise is generated during the switch and dynamic power is consumed.

In an embodiment, the invention is an integrated circuit including an array of nonvolatile memory cells, wherein the array includes a metal bit line divided into a first segment and a second segment. In particular, the metal bit line is connected or strapped to the bit line node of a column of memory cells in the array. A first pass gate is connected between the first and second segment. A second pass gate is connected between the first segment and a supply line. For example, the supply line may be VPP or VSS. In one implementation, the first and second pass gates are NMOS transistors. In another implementation, the first and second pass gates are CMOS pass gates.

In operation, the supply line is selectively connected to VPP or VSS, where VPP is a programming voltage level above a VCC level for the integrated circuit. VSS is ground. The invention may further include a third pass gate connected between a VPP line and the first supply line, and a fourth pass gate coupled between a VSS line and the first supply line. In a first mode of operation, the first pass gate is on and the second pass gate is off. In a second mode of operation, the first pass gate is off and the second pass gate is on.

Furthermore, the memory cells may be floating gate memory cells, which include Flash, EEPROM, or EPROM memory cells. The memory cells may be multistate memory cells. Each memory cell is capable of storing a plurality of binary bits of data.

In another embodiment, each segment can have its own dedicated connection to VSS and VPP. Specifically, a second pass gate is connected between the first segment and a first supply line. And, a third pass gate is connected between the second segment and a second supply line. For example, the fast supply line may be VPP, and the second supply line may be VSS, or vice versa. In one implementation, the first, second, and third pass gates are NMOS transistors. In another implementation, the first, second, and third pass gates are CMOS pass gates.

In operation, the first supply line is selectively connected to VPP or VSS, where VPP is a programming voltage level above a VCC level for the integrated circuit. The second supply line is selectively connected to VPP or VSS, wherein VPP is a voltage level above a VCC level for the integrated circuit. VSS is ground. The invention may further include a fourth pass gate connected between a VPP line and the first supply line, and a fifth pass gate coupled between a VSS line and the first supply line.

In a first mode of operation, the first pass gate is on and the second and third pass gates are off. In a second mode of operation, the first pass gate is off and the second pass gate is on. Further in the second mode of operation, the third pass gate is off.

Other objects, features, and advantages of the present invention will become apparent upon consideration of the following detailed description and the accompanying drawings, in which like reference designations represent like features throughout the figures.

DETAILED DESCRIPTION

Figure 1:
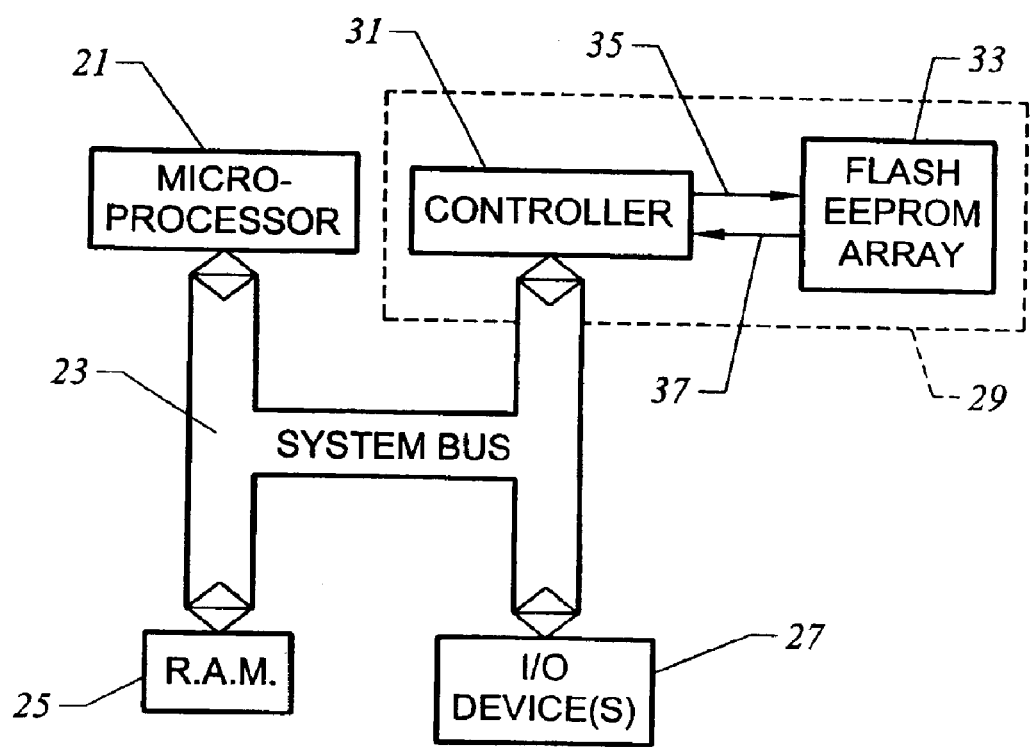
FIG. 1 generally shows an electronic system which various aspects of the present invention may be incorporated.

FIG. 1 generally shows an electronic system, such as a computer system, in which various aspects of the present invention may be incorporated. Some examples of electronics systems include computers, laptop computers, handheld computers, palmtop computers, personal digital assistants (PDA), MP3 and other audio players, digital cameras, video cameras, electronic game machines, wireless and wired telephony devices, answering machines, voice recorders, and network routers. This electronic system architecture includes a processor or microprocessor 21 connected to a system bus 23, along with random access, main system memory 25, and at least one or more input-output devices 27, such as a keyboard, monitor, modem, and the like. Another main computer system component that is connected to a typical computer system bus 23 is an amount of long-term, nonvolatile memory 29. In contrast to volatile memory such as DRAM (dynamic RAM) or SRAM (static RAM), nonvolatile memory retains its stored state even after power is removed from the device. Typically, such a memory is a disk drive using magnetic or optical technology with a capacity of megabytes, gigabytes, or terabytes of data storage. This data is retrieved into the system volatile memory 25 for use in current processing, and can be easily supplemented, changed, or altered.

One aspect of the invention is the substitution of a specific type of semiconductor memory system for the disk drive but without having to sacrifice nonvolatility, ease of erasing and rewriting data into the memory, speed of access, low cost and reliability. This is accomplished by employing an array of electrically erasable programmable read only memories (e.g., EEPROMs) integrated circuit chips. This type of memory has additional advantages of requiring less power to operate, and of being lighter in weight than a hard-disk drive magnetic media memory, thus being especially suited for battery-operated portable computers. Such nonvolatile semiconductor memories include Flash disk drives, Compact-Flash (TM) cards, SmartMedia (TM) cards, personal tags (P-Tag), multimedia cards, secure digital (SD) cards, and Memory sticks (R).

The bulk storage memory 29 is constructed of a memory controller 31, connected to the computer system bus 23, and an array 33 of Flash or EEPROM integrated circuit chips. Data and instructions are communicated from the controller 31 to the Flash or EEPROM array 33 primarily over a data line 35. Similarly, data and status signals are communicated from the Flash or EEPROM 33 to the controller 31 over data lines 37. Data lines 35 and 37 may be serial or parallel, depending on the implementation. Other control and status circuits between the controller 31 and the EEPROM array 33 are not shown in FIG. 1. Furthermore, the controller and memory may be on separate integrated circuits or a memory integrated circuit may incorporate the controller. The memory may reside on separate integrated circuits. For example, multiple memory integrated circuits may in combined to obtain the desired memory size.

Further discussion of Flash EEPROM systems and nonvolatile cells and storage is discussed in U.S. Pat. Nos. 5,602,987, 5,095,344, 5,270,979, 5,380,672, 5,712,180, 5,991,517, 6,222,762, and 6,230,233, which are incorporated by reference along with all references cited in this application.

Figure 2:
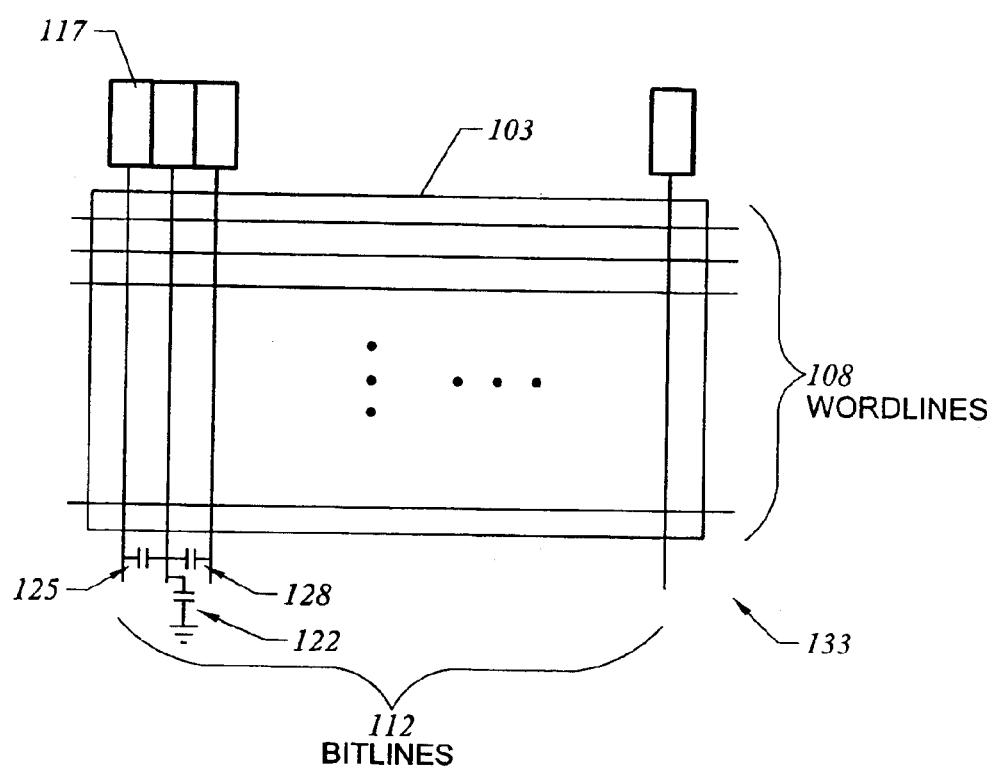
FIG. 2 shows an array of memory cells with wordlines and bitlines.

FIG. 2 shows an array of memory cells 103 a memory integrated circuit (or chip). In an embodiment, this array is part of the Flash memory 33 of FIG. 1. There may be multiple arrays of memory cells on a single chip. The integrated circuit may be a memory such as a Flash chip or may be another type of integrated circuit with an embedded memory portion, such as an ASIC or microprocessor with on-chip memory. The memory cells store binary information. In a specific embodiment, the memory cells are nonvolatile memory cells. Examples of some nonvolatile memory cells are floating gate cells (Flash, EEPROM, or EPROM cells), phase-change cells, ferroelectric cells (FRAM), magnetic cells (MRAM), and others. The memory cells are arranged in an array of rows and columns. There may be any number of rows and columns. The memory cells are accessed using rows of the array.

Rows of memory cells 108 are connected to wordlines or row lines of the memory cells. Columns of memory cells 112 are connected to bitlines or column lines of the memory cells. For operation of the memory cells, the wordlines and bitlines are connected to appropriate voltages in order to perform a desired operation on the memory cell or cells. For example, for configuration of the memory cells, such as erase or program, the wordlines and bitlines are connected to appropriate voltages in order to configure the memory cell to the desired state. These voltages are typically high voltages, voltages at levels above the VCC (or VDD) level of the chip. The high voltage levels for programming may be referred to as a VPP voltage. For example, voltage pumps 117 may be connected to the bitlines of the integrated circuit. And for some operations, the bitlines may need to connected to ground or VSS.

FIG. 2 also shows an area 133. Area 133 is an area outside the array 103 of memory cells, but still within the same integrated circuit. For example, outside the memory array are the voltage pumps 117 and other circuitry used in the operation of the memory integrated circuit. Examples of such circuitry in area 133 include charge pumps, sense amplifier, programming circuitry, erase circuitry, decoders, pads, input buffers, output buffers, logic, reference voltage generators, and others.

In a specific embodiment, the memory cells are multistate cells, capable of storing multiple bits of data per cell. Multistate memory cells may store two or more bits of data, such as three, four, and more. Cells capable of storing multiple bits of data per cell may also sometimes be referred to as multibit or multilevel cells. Details of some specific implementations of a multistate memory cell are discussed in U.S. Pat. No. 5,991,517, which is incorporated by reference. The principles of the invention would also apply to these types of multistate memory cells.

Figure 3:
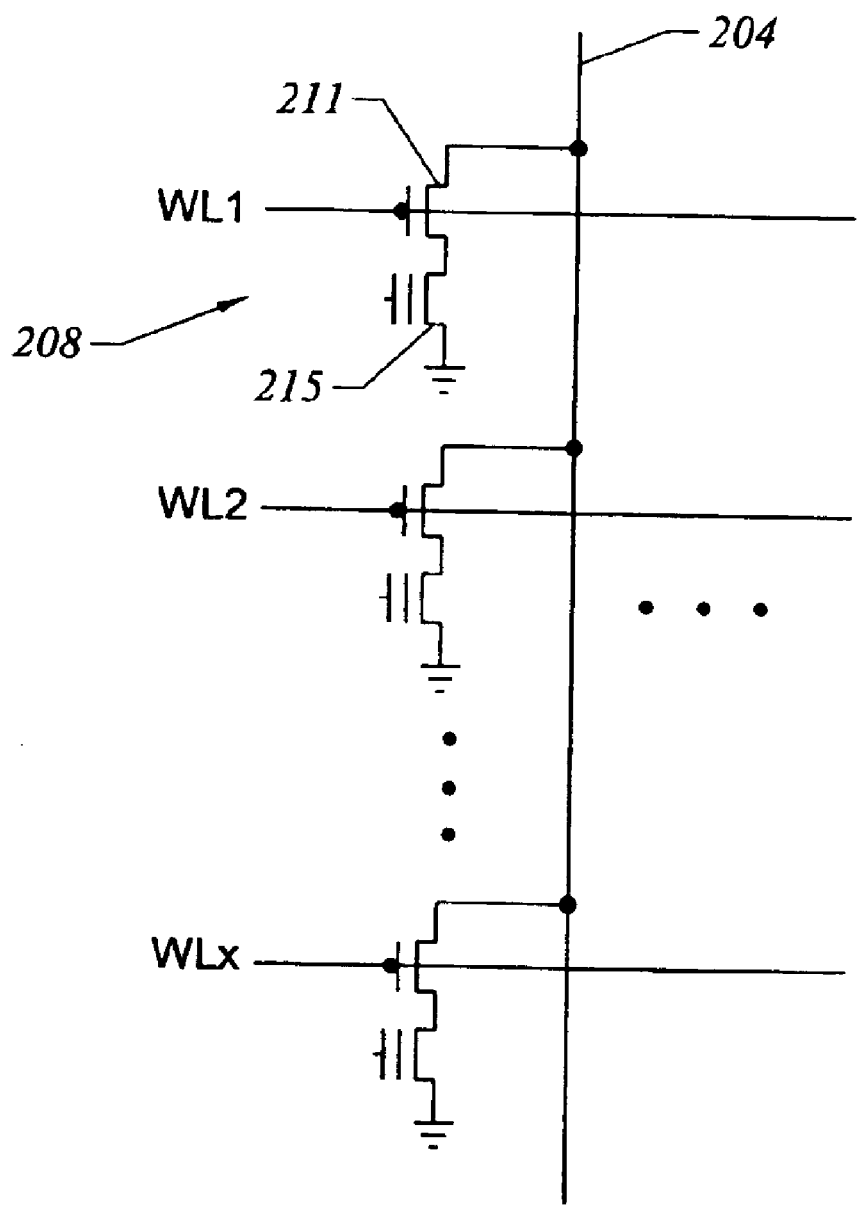
FIG. 3 shows a more detailed diagram of some nonvolatile memory cells connected to a single bitline.

FIG. 3 shows a more detailed diagram of one bitline 204 of memory cells. On one bitline there are a number memory cells 208. Each memory cell has a select transistor 211 and a nonvolatile memory cell transistor 215. The select transistor may sometimes be referred to as a read transistor. A gate electrode for each select transistor of the bitline is connected to a different wordline. So, for bitline 204, the select transistors are connected to bitlines WL1 to WLx, where x is an integer. In an embodiment, transistor 215 may be a floating gate transistor such as a Flash cell as discussed above. Gate of the floating transistors may be referred to as a control gate or erase gate electrode and are connected together. The memory cells shown in FIG. 3 and elsewhere in this application are shown merely as an example, and the invention also applies to other types of memory cells. For example, the memory cells may be MRAM, FRAM, or phase-change devices. And, the invention may also be applied to volatile memory cells such as DRAM and SRAM cells.

The bitlines are generally connected using diffusion. In the case where the select transistor is an NMOS or n-channel transistor, the diffusion is n+diffusion. In order to minimize resistance, this bitline is strapped (connected) to an upper layer metal or other conductor with less resistance than diffusion. A specific embodiment discussed in this application has a bitline strapped in a second-layer metal, metal-2. However, it is understood that for a given integrated circuit process there are typically many different layers of metal, and a given process may have two or more layers of metal. The invention would apply similarly to bitlines run and connected to metal or other electrically conductive layers other than metal-2. For example, the bitline of the invention may be run in any metal or conductive layer such as metal-1, metal-2, metal-3, metal-4, metal-5, metal-6, or others.

In a specific embodiment, the bitline is strapped to metal-2 (second-layer metal) using a metal-1 (first-layer metal, below the second-layer metal) jumper. In this approach, the bitlines of FIGS. 2 and 3 are run in metal-2 and the wordlines are run in metal-1. The wordlines and bitlines are generally not run in the same metal layer since this would mean the metal wordlines and bitlines would short each other out. In an alternative embodiment, the bitlines and wordlines are run in metal-1 and metal-2, respectively.

Each of the bitlines (array lines) have parasitic capacitance to ground (e.g., parasitic capacitance 122 of FIG. 2). FIG. 3 does not show parasitic capacitances to ground in order to simplify the diagram, but is shown in FIG. 2. Further, there is parasitic capacitance not only to ground, but between the bitlines themselves as well (e.g., parasitic capacitances 125 and 128). These parasitic capacitances are distributed capacitances, distributed on the bitline.

Although not a DC component, charging and discharging the bitlines translate into a large current, especially for massive parallel (read or) programming, when speed (performance) is an important factor. As an example, although the bitline parasitic capacitance may be about 1 picofarads to 3 picofarads, charging 2000 bitlines during programming, at a VPP level of about 6.5 volts in about 0.5 microseconds translates into about 25 milliamps to 80 milliamps of VPP current. This could translate into about 100 milliamps to about 250 milliamps of IDD current total. This is a significant amount of dynamic power consumption. This can be a serious limitation to the number of cells that can be processed in parallel, and thus to the performance.

Figure 4:
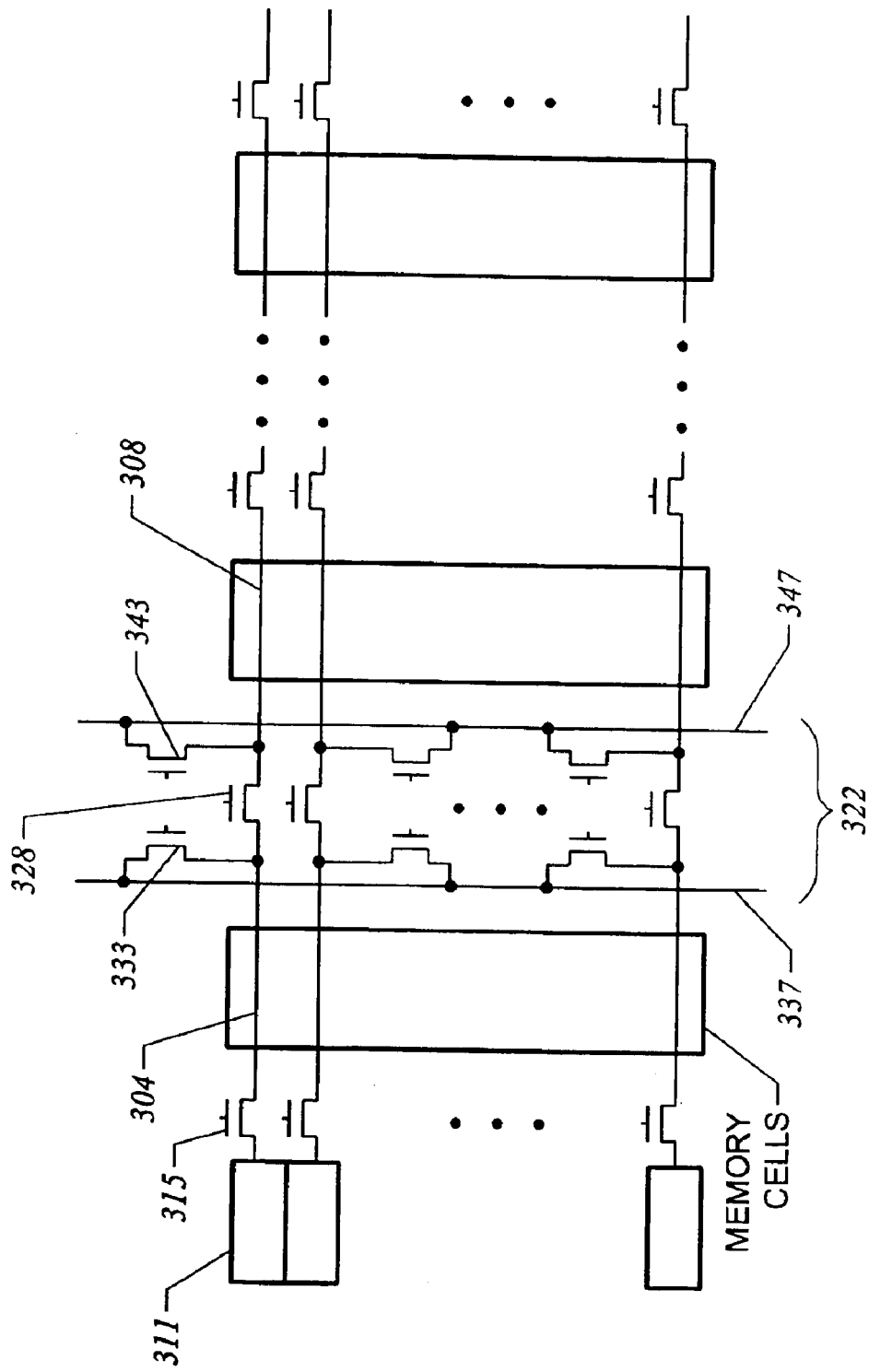
FIG. 4 shows an array of memory cells where the metal layer connected to the bitlines is segmented.

FIG. 4 shows another organization for an array memory cells. The metal (e.g., metal-2) bits lines are broken into a number of segments, such as 304 and 308. In a specific example, the array of memory cells is divided into eight portions and there are seven metal bitlines portions. At an end of the array is circuitry 311 to be connected to the bitlines. These are connected or disconnected to the bitlines using pass gates 315.

Between metal bitline segments is circuitry 322. In an embodiment, this circuitry is present between every other metal bitline segment. The circuitry for one bitline includes three transistors. A pass transistor or pass gate 328 which can connect segments 304 and 308 together. There is a pass transistor 333 which can connect or disconnect segment 304 to a line 337. There is a pass transistor 343 which can connect or disconnect segment 308 to a line 347. The pass transistors shown are NMOS transistors. However, there are many implementation of pass transistors that may be used, and combinations of these. For example, the pass transistors may be a CMOS pass gate, where NMOS and PMOS transistors are connected in parallel.

When the gate of the pass transistors is asserted (such as connected the VCC), the pass transistors connects its source and drains nodes by a very low resistance path. This may be referred to as turning a pass gate on or an ON pass gate. For example, when the gate of transistor 328 is connected to VDD, segments 304 and 308 are effectively connected together. Similarly, when the gate of transistor 333 is connected to VDD, segment 304 is effectively connected to line 337. And, when the gate of transistor 343 is connected to VDD, segment 308 is effectively connected to line 347. When the pass gates are connected to ground, they disconnect the source and drain nodes. This may be referred to as turning a pass gate off or an OFF pass gate.

Another approach which may be used is to use high voltage pass gates, where a voltage higher than VCC is connected to the gate of the pass gate. This will lower the resistance or impedance between the source and drain.

Figure 5:
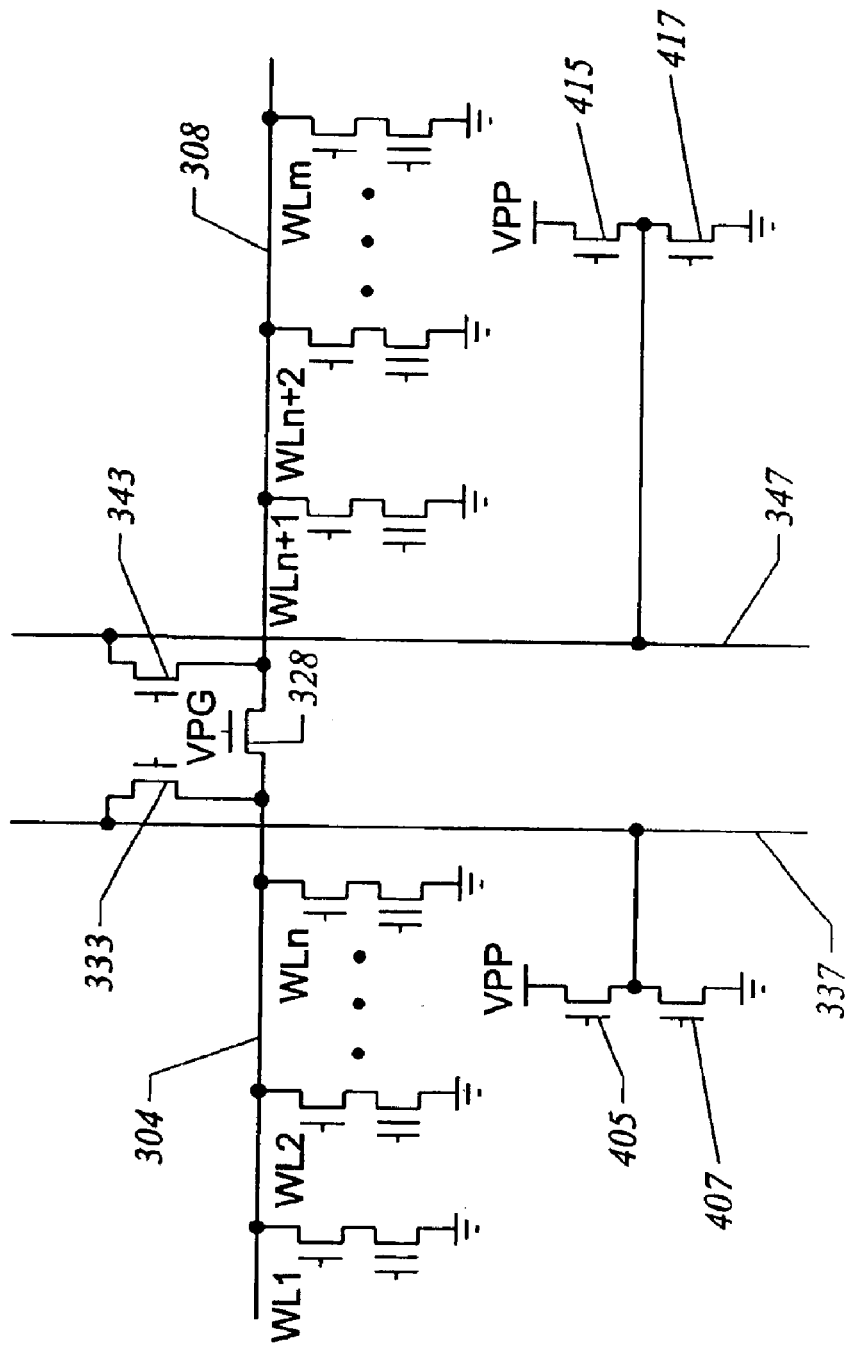
FIG. 5 shows a more detailed diagram of one segmented metal bitline and memory cells.

FIG. 5 shows a more detailed diagram of metal segments 304 and 308 and the circuitry between the segments. In this figure, the gate or control electrode of transistor 328 is referred to as the VPG node. Bitlines for memory cells of wordlines WL1 to WLn are connected to metal segment 304. Bitlines for memory cells of wordlines VWLn+1 to WLm are connected to metal segment 308. In the case the memory cells are evenly divided, m will be equal to 2*n since there will be an equal number of memory cells for each segment. A metal bitline segmentation includes three pass transistors, one acting as a (serial) connect or disconnect device to a data node, and the others as local paths to ground or a voltage source, either VPP or a stop voltage (e.g, VSS). This present combination also acts as a Y selection. Some modes of operation for the segmented memory array architecture are summarized in the following table A.

TABLE A

|  | Pass Gate 333 | Pass Gate 328 | Pass Gate 343 |
|---|---|---|---|
| Mode A | OFF | ON | OFF |
| Mode B | ON | OFF | OFF |
| Mode C | OFF | OFF | ON |

When an entire portion of an array of memory cells is in mode A, the individual segments of the array are connected together. Then the array may be operated similarly as the array shown in FIG. 2. In mode B, segment 304 is connected line 333. This segment may be connected to VPP through a pass gate 405 or connected to VSS through a pass gate 407, depending on the desired operation. In mode C, segment 308 is connected to line 347. This segment may be connected to VPP through a pass gate 415 or connected to VSS through a pass gate 417, depending on the desired operation. In an embodiment, pass gates 405,407,415, and 417 are formed outside (such as in area 133 of FIG. 2) of the array of memory cells and outputs, lines 334 and 347 are fed into the array. This configuration allows maximal packing of the memory cells. In an alternative embodiment, pass gates 405, 407, 415, and 417 are embedded within the array of memory cells.

By splitting the metal bitline into a number of segments and conveniently connecting or isolating them, the high AC current during programming or read is accordingly reduced. This is because the length of a metal segment is much shorter than the entire metal segment (such as in FIG. 2). There is less parasitic capacitance for a shorter segment, and thus the performance when doing parallel read or programming improves and the dynamic power consumption goes down.

Figure 6:
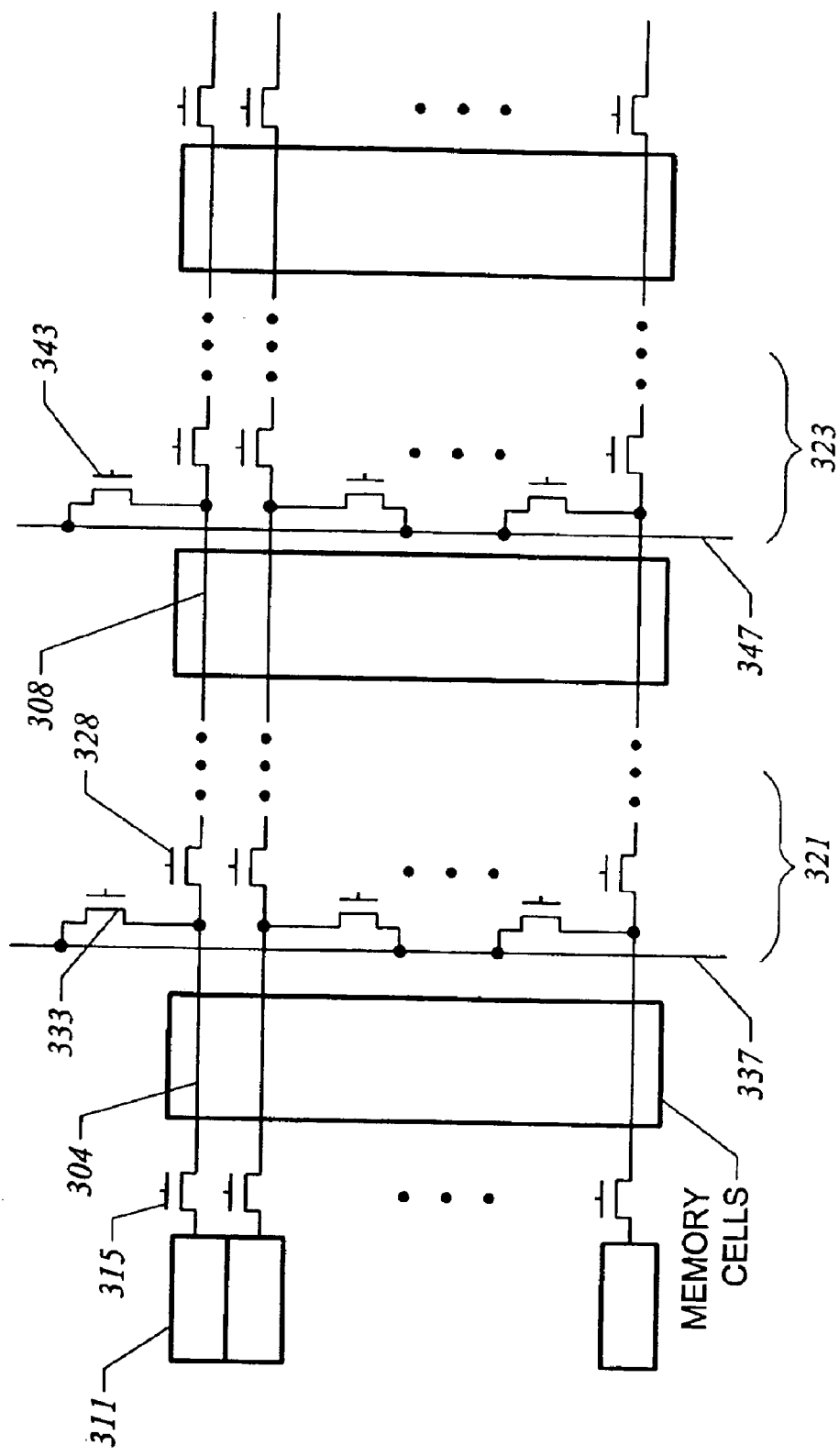
FIG. 6 shows another embodiment of an array of memory cells where the metal layer connected to the bitlines is segmented.

FIG. 6 shows another organization for an array memory cells. This organization is similar to that in FIG. 4, but the circuitry between the segments of the memory is allocated differently. However, the operation of the circuitry will be similar. The metal (e.g., metal-2) bits lines are broken into a number of segments, such as 304 and 308. In a specific example, the array of memory cells is divided into eight portions and there are seven metal bitlines portions. At an end of the array is circuitry 311 to be connected to the bitlines. These are connected or disconnected to the bitlines using pass gates 315.

Between each metal bitline segment is circuitry 321. Circuitry 323 is similar circuitry to circuitry 321 in an adjacent location between segments. In portion 321, the circuitry for one bitline includes two transistors. A pass transistor or pass gate 328 which can connect segments 304 and 308 together. There is a pass transistor 333 which can connect or disconnect segment 304 to a line 337. In portion 323, there is a pass transistor 343 which can connect or disconnect segment 308 to a line 347. The pass transistors shown are NMOS transistors. However, there are many implementation of pass transistors that may be used, and combinations of these. For example, the pass transistors may be a CMOS pass gate, where NMOS and PMOS transistors are connected in parallel.

When the gate of the pass transistors is asserted (such as connected the VCC), the pass transistors connects its source and drains nodes by a very low resistance path. This may be referred to as turning a pass gate on or an ON pass gate. For example, when the gate of transistor 328 is connected to VDD, segments 304 and 308 are effectively connected together. Similarly, when the gate of transistor 333 is connected to VDD, segment 304 is effectively connected to line 337. And, when the gate of transistor 343 is connected to VDD, segment 308 is effectively connected to line 347. When the pass gates are connected to ground, they disconnect the source and drain nodes. This may be referred to as turning a pass gate off or an OFF pass gate.

Another approach which may be used is to use high voltage pass gates, where a voltage higher than VCC is connected to the gate of the pass gate. This will lower the resistance or impedance between the source and drain.

Figure 7:
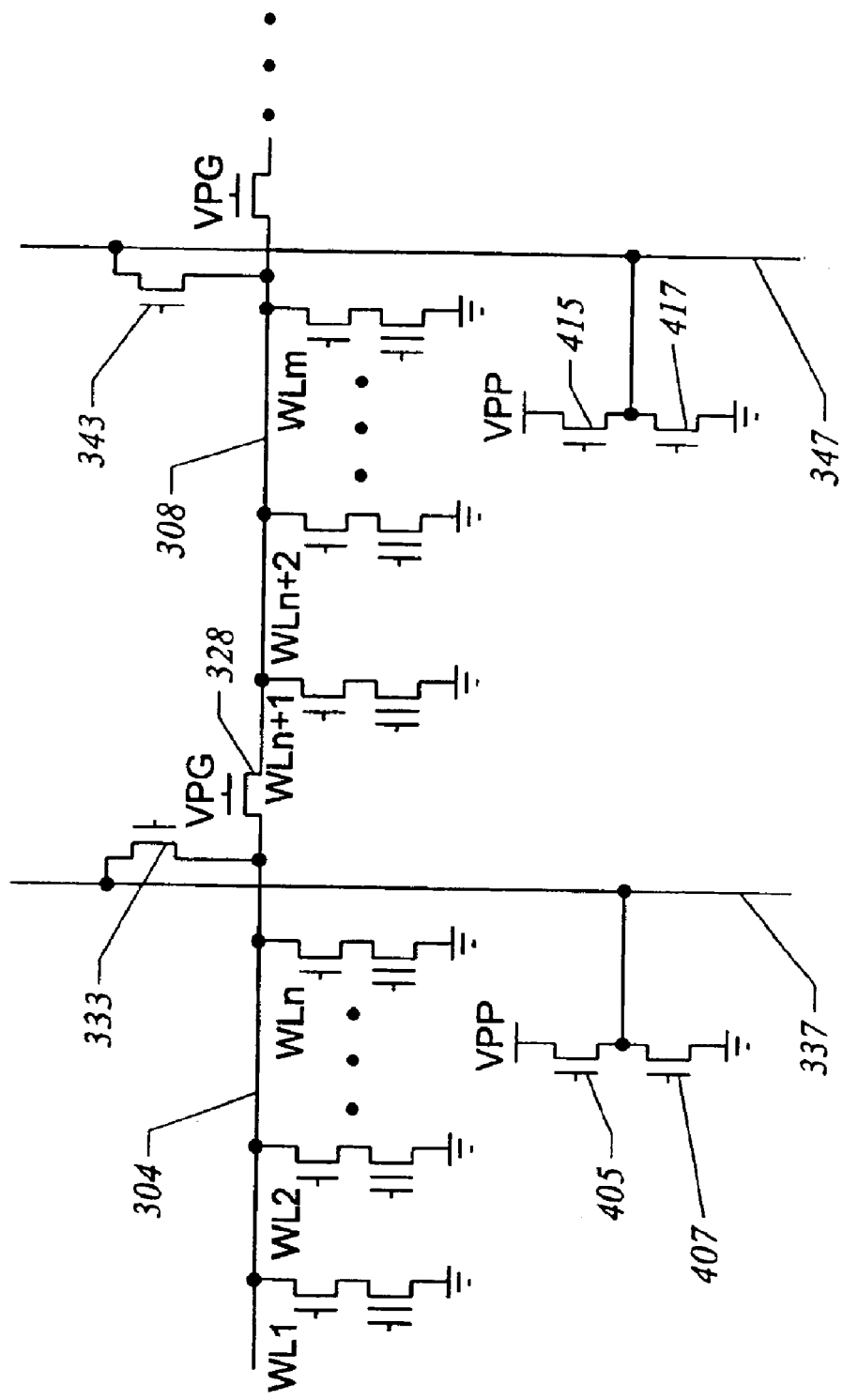
FIG. 7 shows a more detailed diagram of one segmented metal bitline and memory cells of FIG. 6.

FIG. 7 shows a more detailed diagram of metal segments 304 and 308 of FIG. 6 and the circuitry between the segments. In this figure, the gate or control electrode of transistor 328 is referred to as the VPG node. Bitlines for memory cells of wordlines WL1 to WLn are connected to metal segment 304. Bitlines for memory cells of wordlines WLn+1 to WLm are connected to metal segment 308. In the case when the memory cells are evenly divided, m will be equal to 2*n since there will be an equal number of memory cells for each segment. A metal bitline segmentation includes two pass transistors, one acting as a (serial) connect or disconnect device to a data node, and the other as a local path to ground or a voltage source, either a stop voltage (e.g., VSS) or VPP, respectively. This present combination also acts as a Y selection. Some modes of operation for the segmented memory array architecture are summarized in the table B below.

TABLE B

|  | Pass Gate 333 | Pass Gate 328 |
|---|---|---|
| Mode A | OFF | ON |
| Mode B | ON | OFF |
| Mode C | OFF | OFF |

When an entire portion of an array of memory cells is in mode A, the individual segments of the array are connected together. Then the array may be operated similarly as the array shown in FIG. 2. In mode B, segment 304 is connected line 333. This segment may be connected to VPP through a pass gate 405 or connected to VSS through a pass gate 407, depending on the desired operation. In mode C, one or more segments is completely disconnected from either neighboring segments or VSS or VPP, or combinations of these. Segment 308 is floating when gate 343 and 328 are off. This removes the capacitance and parasitic capacitance of segment 308 from the rest of the array, and may be used to improve the performance when operating on another segment of the array. In an embodiment, pass gates 405, 407, 415, and 417 are formed outside (such as in area 133 of FIG. 2) of the array of memory cells and outputs, lines 334 and 347 are fed into the array. This configuration allows maximal packing of the memory cells. In an alternative embodiment, pass gates 405, 407, 415, and 417 are embedded within the array of memory cells.

By splitting the metal bitline into a number of segments and conveniently connecting or isolating them, the high AC current during programming or read is accordingly reduced. This is because the length of a metal segment is much shorter than the entire metal segment (such as in FIG. 2). There is less parasitic capacitance for a shorter segment, and thus the performance when doing parallel read or programming improves and the dynamic power consumption goes down.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An integrated circuit, comprising:

an array of re-programmable non-volatile memory cells, wherein the array includes a plurality of conductive bit lines individually divided into at least first and second segments having memory cells connected thereto;

a first pass gate arranged to connect the first and second segments together when operating in a first mode but leaving the first and second segments disconnected when operating in a second or a third mode;

a second pass gate arranged to connect the first segment to a first voltage supply when operating in the second mode but leaving the first segment disconnected from the first voltage when operating in at least the first mode;

a third pass gate arranged to connect the second segment to a second voltage supply when operating in the third mode but leaving the second segment disconnected from the second voltage when operating in at least the first mode.

2. The integrated circuit of claim 1 wherein the memory cells individually include a floating gate.

3. The integrated circuit of claim 1 wherein the memory cell cells are individually capable of storing more than one bit of data.

4. The integrated circuit of claim 1 wherein the first, second, and third pass gates comprise NMOS transistors.

5. The integrated circuit of claim 1 wherein the first, second, and third pass gates comprise CMOS pass gates.

6. The integrated circuit of claim 1, wherein:

the first voltage is supplied through a fourth pass gate connected to a VPP; and the first voltage is alternately supplied through a fifth pass gate connected to a VSS source.

7. The integrated circuit of claim 6 wherein the VPP line is at or above a VCC supply voltage for the integrated circuit.

* * * * *